United States Patent [19]

Kurtz

[11] Patent Number: 4,814,845

[45] Date of Patent: Mar. 21, 1989

[54] CAPACITIVE TRANSDUCERS EMPLOYING HIGH CONDUCTIVITY DIFFUSED REGIONS

[75] Inventor: Anthony D. Kurtz, Teaneck, N.J.

[73] Assignee: Kulite Semiconductor Products, Inc., Leonia, N.J.

[21] Appl. No.: 926,215

[22] Filed: Nov. 3, 1986

[51] Int. Cl.$^4$ ............................................. H01L 27/20
[52] U.S. Cl. .......................................... 357/26; 357/51
[58] Field of Search ......................... 357/26, 74, 51, 73

[56] References Cited

U.S. PATENT DOCUMENTS

| | | | |
|---|---|---|---|
| 3,715,638 | 2/1973 | Polye | 357/26 |
| 3,753,196 | 8/1973 | Kurtz et al. | 357/26 |
| 3,800,264 | 3/1974 | Kurtz et al. | 357/26 |
| 4,203,128 | 5/1980 | Guchel et al. | 357/26 |
| 4,531,267 | 7/1985 | Royer | 357/26 |

*Primary Examiner*—Andrew J. James
*Assistant Examiner*—Sheila V. Clark
*Attorney, Agent, or Firm*—Arthur L. Plevy

[57] ABSTRACT

A semiconductor capacitive transducer structure is fabricated by utilizing layers in a sacrificial wafer. By processing the sacrificial wafer, one can obtain a P+ region which is indicative of one plate of the capacitor. A carrier wafer has a dielectric layer on the top surface which includes a layer of glass. The sacrificial wafer, after being subject to diffusion of highly doped semiconductor materials, contains peripheral flange and a capacitive region which is indicative of a capacitive plate. By utilizing selective etching, one can thus form a capacitive structure on the sacrificial wafer which is bonded to the carrier wafer by means of an electrostatic bond. The flange is covered with a metallized glass sheet bonded thereto. Essentially, the thin metal layer of the glass sheet acts as a second plate for the capacitive structure. The carrier wafer may be treated so that is has an aperture which underlies the tip composite surface. This aperture defines an active deflection area to therefore enable capacitance variations with applied force. In any event, the carrier wafer can remain as a solid wafer without the aperture to therefore provide a fixed capacitor. Due to the simplicity of the techniques and the methods afforded, such devices can be easily connected in bridge arrangements or utilized in conjunction with an oscillator to provide frequency outputs which are proportional to a force applied to the active deflection area.

20 Claims, 2 Drawing Sheets

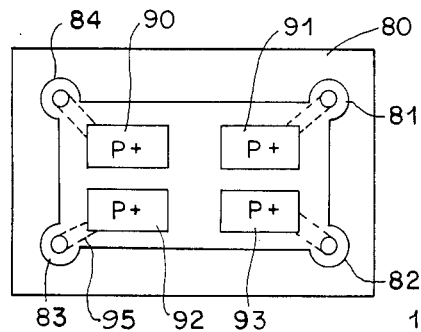
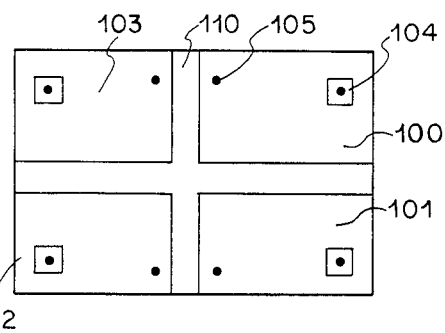
FIG. 8     FIG. 9
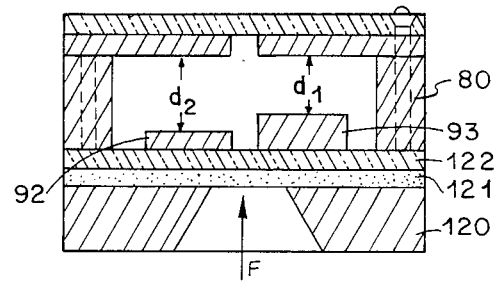
FIG. 10
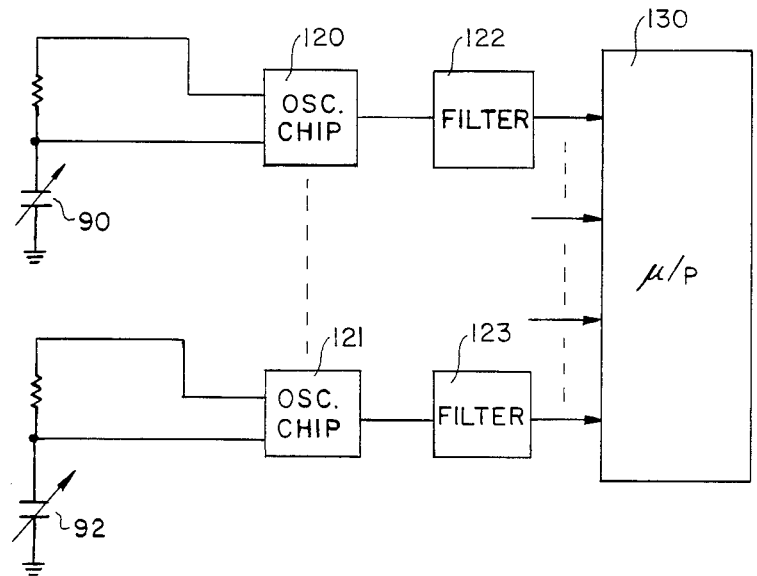
FIG. 11

CAPACITIVE TRANSDUCERS EMPLOYING HIGH CONDUCTIVITY DIFFUSED REGIONS

BACKGROUND OF THE INVENTION

This invention relates to transducers in general and more particularly to a capacitive transducer formed by integrated circuit technology.

The prior art includes a variety of devices which generally fall into the category of transducers. Many of these devices employ piezoresistive elements. Essentially, such elements exhibit a change in resistance as a function of applied pressure or force.

Piezoresistive devices may be mounted on a diaphragm which diaphragm deflects upon application of a force. The diaphragm can be fabricated from silicon or another semiconductor material. Hence the elements can be diffused into the diaphragm by conventional integrated circuit techniques.

Another class of pressure transducers employs a variation of capacitance to determine the magnitude of applied force. Essentially, these devices operate to vary the effect of capacitance between a movable plate and a stationary plate. The movable plate can also be a flexible diaphragm which will deflect upon application of a suitable force in an amount proportional to the force. Movement of the plate serves to vary the effective distance between this plate and the fixed plate. The operation of such devices is extremely well-known.

In any event, both types of transducers have their particular utility and associated advantages and disadvantages. Capacitive type transducers are usually difficult to fabricate and are not necessarily compatible with conventional integrated circuit techniques. The prior art has continuously attempted to fabricate a capacitive transducer utilizing integrated circuit techniques, but such devices are attendant with various problems.

For an example of a capacitive transducer employing integrated circuit techniques, reference is made to U.S. Pat. No. 3,748,541 entitled PRESSURE SENSITIVE TRANSDUCERS EMPLOYING CAPACITIVE AND RESISTIVE VARIATIONS issued on July 4, 1973 to A. D. Kurtz and assigned to Kulite Semiconductor Products, Inc., the assignee herein. As is evident from that patent and other patents which exist, there is also a desire to produce a capacitive transducer which can be hermetically sealed. This enables improved temperature operation and a more reliable and consistent circuit operation.

It is therefore an object of this invention to provide a capacitive transducer which is simple to fabricate and easy to use and which device can be mass produced.

A further object of this invention is to provide a capacitive transducer or a capacitor which may be variable or of a fixed value depending upon the particular application.

Another object of this invention is to provide a capacitive transducer which can be hermetically sealed and which can provide controllable values of capacitance.

A further object of this invention is to provide a means of avoiding stray capacitance of PN junction by dielectrically isolating the two capacitor plates from the resulting mechanical structure.

BRIEF DESCRIPTION OF THE PREFERRED EMBODIMENT

A semiconductor capacitor transducer comprising a first wafer of semiconductor material having on a top surface a dielectric layer including a layer of glass and having bonded to said layer at least one capacitive plate of a high conductivity semiconductor material surrounded by a peripheral flange of said same high conductivity, said peripheral flange having at least one partial aperture located on the inner surface, with an upstanding cylindrical post surrounded by said aperture and of said high conductivity material with said post electrically coupled to said plate region, a glass cover sheet having a metallized bottom area in contact with and bonded to said flange to cover said plate region, with said metallized area forming a second plate for said capacitor.

BRIEF DESCRIPTION OF THE FIGURES

FIG. 8 is a top plan view of an alternate embodiment of a capacitive transducer employing multiple capacitors.

FIG. 9 is a top plan view of a treated glass sheet having selective metallized areas employed with the transducer of FIG. 8.

FIG. 10 is a cross sectional view necessary to further explain the construction of the transducer of FIG. 8.

FIG. 11 is a circuit diagram showing one particular use for a multiple capacitive transducer.

DETAILED DESCRIPTION OF THE FIGURES

Before proceeding with a description of the device, it is indicated that the capacitive transducer to be described is fabricated by means of diffusion and selective etching techniques and employs similar techniques as described in a co-pending application entitled FABRICATION OF DIELECTRICALLY ISOLATED FINE LINE TRANSDUCERS AND APPARATUS, U.S. Ser. No. 804,761, filed on Dec. 6, 1985 for A. D. Kurtz et al. and assigned to the assignee herein.

Reference is also made to U.S. patent application Ser. No. 860,523, filed on May 7, 1986 for A. D. Kurtz et al. and entitled INTEGRAL TRANSDUCER STRUCTURES EMPLOYING HIGH CONDUCTIVITY SURFACE FEATURES.

Figure 1:
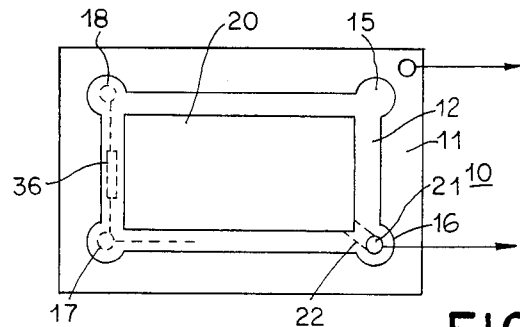
FIG. 1 is a top plan view of a capacitive transducer according to this invention.

Referring to FIG. 1, there is shown a top plan view of a capacitive transducer according to this invention.

The transducer 10 has a top plan view which essentially is characterized in having a peripheral flange 11 which as will be explained is formed in a sacrificial semiconductor wafer by selectively etching the same after high conductivity diffusion. The peripheral flange 11 surrounds an entire inside area 12, and as will be explained, the peripheral flange is fabricated from a P+ layer which is selectively diffused in an N-type silicon wafer. The N-type silicon wafer as will be subsequently described, is referred to as a sacrificial wafer. The term "sacrificial wafer" is a term which has been employed in the above-noted co-pending applications.

The peripheral flange 11, as indicated, is formed by a diffusion technique, and as will be explained, the length of time of diffusion can produce different depth P+ regions which essentially form the main capacitive transducer structure.

As seen from FIG. 1, the peripheral flange 11 has four partial apertures as 15, 16, 17, and 18 formed in the four corners of the device. As will be further explained, in order to provide a capacitive structure, four apertures are not required. In any event, as one can ascertain, by referring to the above-noted applications, the top plan configuration as shown 30 in FIG. 1 has a similar appearance to the structure shown in U.S. Ser. No. 860,523 as referenced above.

In the center area, there is diffused a rectangular or square area 20 which essentially consists of P+ semiconductor material and which as will be explained forms one plate of the capacitor to be described. During the fabrication process, a post 21 is formed by the same diffusion process, and for example as shown in FIG. 1, is located relatively centrally with respect to aperture 16. The post 21 is in conductive contact with the rectangular P+ area 20 by means of a conductive area 22 also formed in the wafer by diffusion. The post 21 is the same height as the flange 11, and this is determined by the diffusion technique employed.

As will be explained, the post 21 forms one contact which couples to the plate 20. Positioned to cover the entire top surface of the flange is a glass sheet 25 which is shown for example in FIG. 2. The glass sheet 25 has a aperture 26 which directly communicates with the top of the post 21 and a second aperture 27 which directly communicates with the flange 11. In any event, the underside of the glass sheet 25 is metallized by means of vapor deposition, RF sputtering or some other technique and is metallized with a thin layer 28 of a suitable metal. This layer of metal forms the second plate of the capacitor as will be explained.

Figure 3:
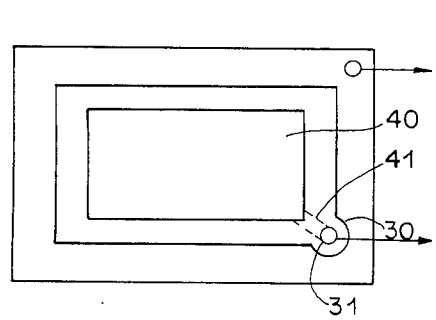
FIG. 3 is a top plan view of an alternate embodiment.

Before proceeding with further descriptions, reference is made to FIG. 3 whereby a similar capacitive transducer is shown in top plan view. In any event, as indicated in FIG. 3, there is only shown one corner aperture 30 which partially surrounds an upstanding post 31. This embodiment is shown by way of example as it should be understood to one skilled in the art that the four apertures as shown in FIG. 1 are not actually necessary in order to produce a capacitive transducer. However, the embodiment shown in FIG. 1 is preferred due to the fact that the basic frame structure as shown in FIG. 1 can be employed to implement various other structures as for example those described in co-pending patent application Ser. No. 860,523.

As also shown in FIG. 1 (in dashed lines) one can fabricate a piezoresistive or resistive element 36 by typical deposition techniques and, if desired, can cause the piezoresistor to contact posts associated with partial apertures 17 and 18. This of course is understood and will be further explained. Essentially, as one can see from FIG. 1 and in regard to the processing techniques described in the co-pending patent applications, one cannot only implement a capacitor but can also implement suitable resistors on the same substrate if desired for purposes of compensation or frequency selection.

It will become clearer as to how the various embodiments can implemented according to this invention.

Again referring to FIG. 3, there is again a central P+ area 40 which is indicative of one plate of a capacitor which area 40 is electrically connected to the upstanding post 31 to provide one terminal for the transducer. The second terminal again is implemented by causing the metallized glass sheet to contact the peripheral flange and is electrostatically or anodically bonded thereto to cover the same. In doing so, the glass sheet is anodically bonded to the top surface of the flange to provide a hermetically sealed transducer. The bonding technique is extensively described in the co-pending applications.

As will be further explained, the entire structure depicted for example in FIGS. 1 and 3 is formed by utilizing highly-doped diffusion in silicon and thereafter employing selective etching to remove undesired material. In this manner, one fabricates P+ layers in an N-type silicon sacrificial wafer, and based on the diffusion techniques and the length of time of the diffusion, these P+ layers can be accommodated to any desired depth. Thus a transducer capacitive structure can be formed by selective diffusion and allowing the diffusion to be accommodated over a given time length resulting in different height plate regions as 20 and 40. This controlled diffusion process results in a P+ capacitive transducer.

Figure 4:
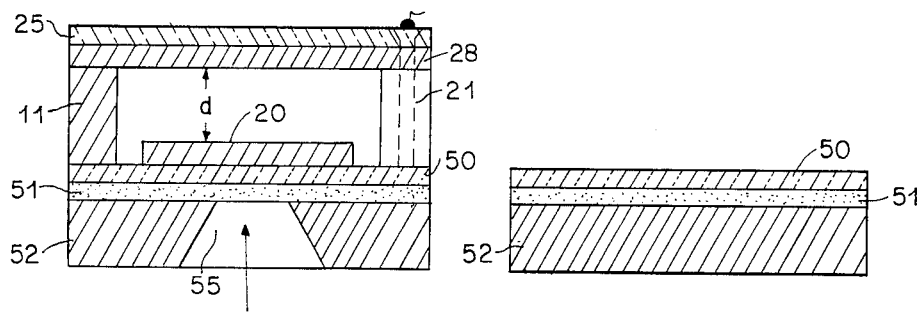
FIG. 4 is a cross sectional view of a capacitive transducer employing a sacrificial and a carrier wafer.

Referring to FIG. 4, there is shown a cross-sectional view of a capacitive transducer according to this invention. In FIG. 4, the reference numerals for the glass sheet and so on have been retained in order to enable one to fully understand the invention. As seen in FIG. 4, the glass sheet 25 is metallized by means of a thin layer of metal 28. The sacrificial wafer consists of an upstanding peripheral flange 11 which is dielectrically isolated by means of a thin glass sheet 50 which essentially is formed on a carrier wafer 52. The processes used in fabricating the device, as indicated, have been extensively described in the co-pending applications but a brief description of the same will be given subsequently.

The carrier wafer 52 which is again single crystal silicon has first deposited thereon a layer 51 of silicon dioxide or silicon nitride. A layer of glass 50 is then deposited or sputtered on the oxide layer 51 to form a composite dielectric layer. The glass layer 50 is then electrostatically bonded to a sacrificial wafer according to techniques described in the co-pending application.

Figure 5:
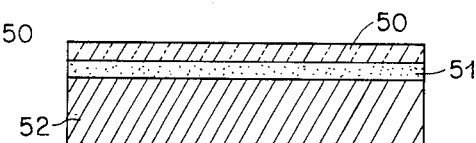
FIG. 5 is a cross sectional view of a carrier wafer section according to this invention.

Referring to FIG. 5, there is shown a cross-sectional view of a carrier wafer 52. Essentially, the carrier wafer 52 consists of a wafer of semiconductor material which is silicon which is coated with a thin layer of silicon dioxide 51. Onto the layer of silicon dioxide is deposited a layer of glass 50. This structure forms the carrier wafer 52. As described in the above-noted patent application Ser. No. 860,523, the sacrificial wafer which essentially contains the capacitive plate pattern as well as the flange are fabricated from N-type silicon which is single crystal and can employ any crystal orientation desired. It is of course noted that the choice of crystal orientation of the carrier wafer is also independent of that of the sacrificial wafer.

Basically, both the sacrificial and carrier wafer may be circular or rectangular in the top plan view and such wafers are commercially available. The sacrificial wafer may be approximately 3 to 5 inches in diameter and approximately 3 to 10 mils in thickness and is essentially the same size as the carrier wafer, as for example shown in FIG. 4. The sacrificial wafer is treated by conventional semiconductor techniques so that the various elements as shown in FIG. 1 which essentially include the peripheral ridge or flange 11, the upstanding cylindrical member or post 21 as well as the central capacitive plate area 20 are fabricated by the use of P+ diffusion which is accommodated by using high concentration P-type impurities. Those regions are formed by highly doped layers in the N-type semiconductor sacrificial wafer. The technique for providing high doping is well known. For example, in order to produce highly doped P-type layers, one uses a diffusion technique which has a high boran concentration to produce a highly doped P layer or P+ region.

The pattern which defines the various regions is determined by masking techniques. Such techniques have been described in great detail in the above-noted co-pending applications. For example, a sacrificial wafer has grown on the top surface a thin layer of silicon dioxide. It is well known to use a layer of silicon dioxide to allow one to diffuse various impurities into the sacrificial wafer. This is accommodated by the formation of a semiconductor pattern which is implemented by the use of photo masks and photo chemical or photo lithographic techniques.

Briefly, the use of such techniques is also well known in the semiconductor art and involves the use of a photoresist or lacquer which is coated over the oxide layer. The thickness of the photoresist may be on the order of several thousand Angstroms. The photoresist having a desired pattern impressed upon the surface is then exposed to ultraviolet light which causes the photo resist to harden according to the pattern on the mask. As indicated, these techniques are well known.

Once the pattern is impressed,, windows are formed via the photoresist pattern. The N-type sacrificial wafer has the various surfaces patterns diffused via the openings in the silicon dioxide layer. As indicated, this is accommodated by P-type diffusion. Essentially, the P-type diffusion uses high concentration P-type impurities. The formation of such highly doped P-type layers is accommodated by using a diffusion technique utilizing boron concentration to produce a highly doped P-layer or P+ region. Each of the regions as the upstanding flange 11, the post 21 and the central capacitive plate region 20 are formed by diffusion of high boran concentration doping. The entire structure on the sacrificial wafer is formed from a plurality of masks.

Each of the patterns can be accurately controlled due to the advances made in the diffusion process. Based on this diffusion process, one achieves a very small temperature coefficient for the final devices. As explained, in the copending application Ser. No. 860,523, one would first formulate the peripheral ridge as well as the upstanding post by utilizing a common mask. In this manner one provides the appropriate structure. After a given length of time during the diffusion process, one then employs a diffusion mask which essentially determines the rectangular area 20 which is a P+ region also fabricated on the sacrificial wafer and may be of a different height from the regions defining the peripheral flange 11 and the upstanding post.

It is of course understood that the height of the P+ region 20 can be accommodated to any given depth, and as will be further explained, one can have capacitors of varying heights and hence separated by varying distances from the top glass plate. After the appropriate diffusions have been made in the sacrificial wafer, one now uses a selective etchant to remove all areas of the sacrificial wafer which are not of P+ conductivity, and in this manner one can obtain a pattern as shown in FIG. 4 which essentially consists of the central plate region 20 which is dielectrically isolated by means of the glass layer 50 from the peripheral flange and which plate region 20 is connected to the upstanding post 21 to form one terminal for the capacitive transducer. The glass plate 25, having the metallized area 28 upon the same, is then anodically bonded to the peripheral flange As indicated, the glass has suitable apertures to contact the post and form a hermetic seal using the post as one contact to therefore form one plate contact of the capacitor. The other contact coacts with the metal layer 28 as overlying the flange 11 to form the other plate of the transducer. The carrier wafer as shown in FIG. 4 can then be selectively etched to include an aperture 55 which essentially forms a deflection diaphragm portion for the capacitive transducer. In this manner if a force is applied in the direction shown by the arrow of FIG. 4, the distance D between the P+ region 20 and the metal area is varied thus creating a variable capacitor.

Figure 6:
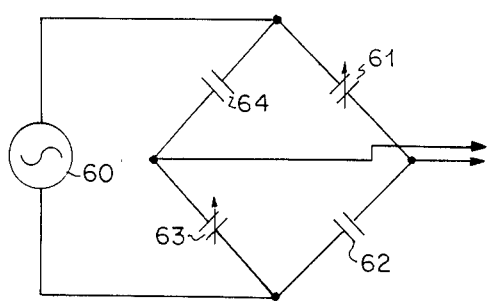
FIG. 6 is a simple circuit diagram showing a capacitive bridge utilizing capacitive transducers according to this invention.

The aperture 55 is selectively formed by etching in the carrier wafer and which techniques again have been extensively described in the above-noted co-pending applications. In any event, if such an aperture 55 is not formed in the carrier wafer then the capacitor thus formed becomes a fixed capacitor of a given value. As one can ascertain by referring to FIG. 6, one can therefore form a bridge using such components which would be biased by a selective frequency signal or AC source 60. One can therefore utilize two variable capacitors as 61 and 63 in the bridge in conjunction with two fixed capacitors as 64 and 64.

Figure 7:
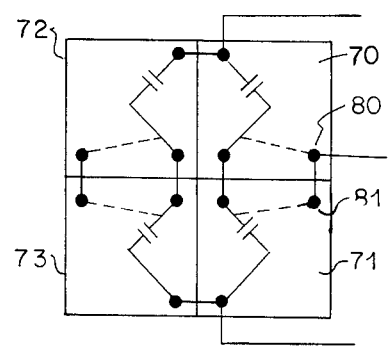
FIG. 7 is a schematic diagram showing the fabrication of a bridge from capacitive transducer modules according to this invention.

As shown in FIG. 7, these capacitive elements which essentially are the structure shown in FIGS. and 3 can be easily connected to form any type of bridge desired. As shown in FIG. 7, the individual units such as 70, 71, 72 and 73 are interconnected by means of the two terminals as for example shown in FIG. 1 to designate the bridge. It is of course understood that the terminal, to enable connection to the peripheral flange and the metal layer 28 of the glass sheet, can be located anywhere along the desired surface of the final transducer structure.

Hence in FIG. 7, there is shown for example a terminal as 80 and 81 which would constitute the terminal which couples the metallized glass sheet 25 to the peripheral flange and this terminal can be located on opposite sides of the transducer in order to enable one to formulate bridges by simply placing four wafer structures together in the orientation depicted in FIG. 7.

Referring to FIG. 8, there is shown a top plan view of still another embodiment of the capacitive transducer which can be fabricated and implemented according to the above-described techniques. Essentially, the transducer as shown in FIG. 8 has the same frame arrangement consisting of the peripheral flange 80 with the four corner apertures 81-84. In each corner aperture there is fabricated an upstanding post which is of the same height as the peripheral flange. There are four P+ regions associated with the transducer shown in FIG. 8 such as regions 90-93. Each region as one can ascertain is a separate rectangular or square region and each has an associated electrical contact area going to a respective post as region 92 coupled to post 83 via contact region 95.

While four plate regions as 90, 91, 92, and 93 are shown in FIG. 8, it is understood there can be fewer than four or more than four depending upon a particular application. The regions are again fabricated by the use of P+ diffusion and selective etching.

Referring to FIG. 9, there is shown a glass sheet which is used to cover the transducer structure. As seen from FIG. 9, the glass sheet has metal areas such as 100 to 103 formed thereon with suitable apertures as 104 and 105 which as explained below will contact the post associated with each capacitive element such as aperture 109 will contact post 81 while aperture 105 will contact the peripheral flange which essentially is a common terminal for each of the capacitors. This terminal as will be subsequently explained may be utilized as a ground terminal for the capacitors.

Each of the metal areas is separated by central cross shaped areas 110 which are glass. In a similar manner as described above, the glass sheet as shown in FIG. 9 is then anodically bonded to the upstanding flange 80 associated with the sacrificial wafer according to this embodiment. Again, the areas are shown in FIG. 10 in cross section, as for example areas 92 and 93.

In FIG. 10 it is immediately noted that the area 93 can be diffused to a greater depth than the area 92. Hence the capacitor associated with area 93 will be of a different value due to the distance D1 from the value of the capacitor associated with area 92. In this way one can selectively control the distances as D1 and D2 and therefore provide multiple capacitors on a single chip each one having different capacitive values and sensitivity. Again, in FIG. 10 the carrier after 120 is shown having an insulating layer 121 and a glass layer 122 which accommodates the dielectrically isolated P+ regions after bonding.

In regard to the formation of multiple capacitors, it is indicated in FIG. 11 that one can therefore utilize each capacitor as for example those indicative of areas 90, 91 92, and 93 as a capacitor element in conjunction with an oscillator circuit.

As seen in FIG. 11, each capacitor as 90 and 93 forms part of an RC circuit which is coupled and therefore controls the frequency of a typical oscillator chip such as 120 and 121. Such chips are well known in the prior art and are available from many sources. Essentially, such chips operate by providing a frequency output as a function of an external capacitor connected to their terminals. Thus as seen, in the case of FIG. 11 there would be four capacitors provided, each of which may have a completely different frequency range. Hence as a force is applied to the diaphragm 10, each frequency associated with each of the oscillators would vary according to the value of the capacitance which would be a function of the deflection of the diaphragm. Hence each of the oscillators will provide a different frequency output.

The output of the oscillators is coupled to a respective associated filter as filters 122 and 123. Thus one can derive from each oscillator a predetermined frequency band. The different frequencies are then applied to a microprocessor 130 or other suitable chip. In this manner one can utilize the structure for example as shown in FIG. 8 employing multiple capacitors to determine where upon the diaphragm the force was applied. As is well known, for a centrally applied force the diaphragm will deflect mainly at the center portion as compared to a force which was offset from the center.

In this manner each of the capacitors would vary by a different amount in regard to the distance from the respective metallic areas according to where the force was applied. This would result in a different frequency for each of the oscillators as a function of where the force was applied. A microprocessor is programmed to contain a suitable algorithm or a table to indicate what frequency would be expected from each of the circuits if the force F were applied to different portions of the diaphragm. Hence one can utilize such a technique employing multiple capacitors for example for use in tactile sensors as well as to determine the magnitude of the force. It becomes immediately clear that the greater the force, the closer the diaphragm portion of the transducer is moved to the metallic layer. In this manner the frequency will change accordingly. Hence the frequency output would be a function of the distance that the diaphragm has been deflected which is directly related to the magnitude of the applied force. Furthermore, the exact location of the applied force with respect to the deflectable portion of the diaphragm is also known due to the fact that the frequency range of the capacitors will vary as a function of where the force is applied to the diaphragm.

It is of course understood that many embodiments can be implemented using this technique in the formation of either fixed or variable capacitors, multiple variable capacitors or the formation of multiple capacitors which are either fixed or variable on single integrated circuit chips. It is understood that the techniques as described above allow one to provide hermetically sealed devices where one effective plate of the capacitor is a P+ region which is dielectrically isolated from the remaining structure.

As indicated above, the techniques for fabricating such devices have been explained in detail in the copending applications, both of which are deemed to be part and parcel of this application. In any event, the utilization of a sacrificial wafer and a carrier wafer to form highly diffused P+ regions which regions can be of different heights enables one to produce different capacitor values or an infinite number of values utilizing the above-described techniques.

It is also understood that a plurality of plates can be deposited on a single chip and hence such a chip can contain different capacitive values.

In regard to the diagram of FIG. 11, it is noted in many applications involving oscillator use one need only have one terminal of the capacitor as a ground and it would correspond to the terminal which contacts the flange area as for example flange area 80 associated with the transducer configuration shown in FIG. 8.

Figure 2:
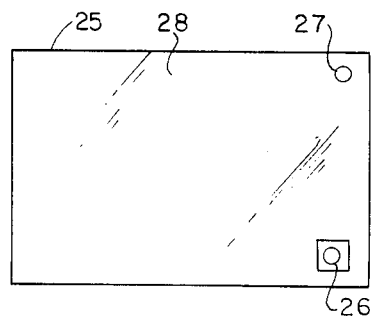
FIG. 2 is a top plan view of glass sheet which is used to hermetically seal the capacitive transducer.

In any event, there are many advantages attributable to the capacitive transducer as for example shown in FIGS. 1, 2, 3, and so on. The advantages of these is that (1) it is a simple device to make and manufacture, as the techniques for making and manufacturing the device are done by diffusion techniques which are accurately controlled. Hence capacitive values can be very accurately achieved and a wide variety of capacitance values can be accommodated by these techniques (2) One can provide a hermetically sealed capacitor by using this technique due to the fact that the entire structure is covered by a glass sheet and due to the fact that the apertures which are implemented to enable one to provide suitable terminals can in fact be hermetically sealed by the anodic bonding process (3) There is no shunt capacity involved with these devices because of the dielectric isolation (4) Using these techniques, capacitors with very small spacings with gaps between the electrodes (on the order of 0.1-0.2 mils) can be readily fabricated. If one utilized PN devices to implement capacitive action then one would obtain severe shunt capacity. This is in the case of varactor diodes or other variable capacitance devices which employ ordinary PN junction technology.

The devices being rectangularly shaped are very easy to couple together as for example shown in FIG. 7 and bridge arrangements can be very simply implemented. Thus it should be obvious to those skilled in the art that there are many advantages associated with the structure described and there are many different embodiments which will become apparent to those skilled in the art upon reading this specification and all are deemed to be within the spirit and scope of the claims appended hereto.

What is claimed:

1. A semiconductor capacitor transducer comprising:
   a first wafer of semiconductor material having on a top surface a dielectric layer including a layer of glass and having bonded to said layer at least one capacitive plate of a high conductivity semiconductor material surrounded by a peripheral flange of said same high conductivity, said peripheral flange having at least one partial aperture located on an inner surface, with an upstanding cylindrical post partially surrounded by said aperture and of said high conductivity material with said post electrically coupled to said plate region, a glass cover sheet having a metallized bottom area in contact with and bonded to said flange to cover said plate region, with said metallized area forming a second plate for said capacitor.

2. The capacitor transducer according to claim 1, wherein said glass sheet has a first aperture overlying said post for providing a first terminal of said capacitor and a second aperture overlying said flange to provide a second terminal for said capacitor.

3. The capacitor transducer according to claim 1, wherein said metallized glass sheet is electrostatically bonded to said flange with said metallized area facing said plate region.

4. The capacitor transducer according to claim 1, wherein said post, said plate region and said flange are all fabricated from the processing of a second sacrificial wafer of a given conductivity.

5. The capacitor transducer according to claim 4, wherein said post, said plate region and said flange are P+ semiconductor material.

6. The capacitor transducer according to claim wherein said glass sheet as bonded to said flange forms a hermetic seal.

7. The capacitor transducer according to claim wherein said bottom surface of said first wafer includes an aperture located below said plate region and indicative of a deflectable diaphragm to cause an applied force to deflect said diaphragm to thereby vary the distance between said plate region and said metallized area to vary the capacitance value according to the magnitude of said applied force.

8. The capacitor transducer according to claim 1, wherein said dielectric layer is a composite layer comprising a first layer of silicon dioxide with a layer of glass covering said silicon dioxide layer.

9. The capacitor transistor according to claim further including a plurality of capacitive plate regions bonded to said glass layer with at least one of said regions being of a different height from others of said regions to thereby form a different capacitive value.

10. A semiconductor capacitor transducer apparatus comprising:
    a first carrier semiconductor wafer having a top composite surface including a first layer of a semiconductor compound with a layer of glass disposed on said compound layer,
    a peripheral semiconductor flange located on said top surface of said carrier wafer and bonded to said glass layer, said peripheral flange including at least one partial aperture formed on the inside wall of said flange, at least one upstanding semiconductor cylindrical member located on said top surface of said carrier wafer and bonded to said glass layer, with said cylindrical member partially surrounded by said aperture and with the height of said member relatively equal to the height of said flange,
    a capacitive plate semiconductor region bonded to said glass layer and surrounded by said flange with an electrical connection coupling said plate region to said cylindrical member,
    a metallized glass sheet bonded to said peripheral flange with said metallized area facing said plate region and having an aperture overlying said post to enable contact to said post via said aperture.

11. The capacitor transducer structure according to claim 10, wherein said capacitor transducer is hermetically sealed.

12. The capacitor transducer according to claim 10, wherein said post, flange and plate region are all fabricated from a common wafer and are of high conductivity semiconductor material.

13. The capacitor transducer according to claim 12, wherein said semiconductor material is P+.

14. The capacitor transducer according to claim 10 wherein said carrier wafer has a bottom surface having an aperture extending towards said top composite surface and defining an active diaphragm area to enable a force applied to deflect said area to thereby provide a variable capacitance according to the magnitude of said applied force.

15. The capacitor transducer according to claim 10, further including a plurality of semiconductor plate regions bonded to said glass layer of said carrier wafer with at least one of said regions of a different height than other of said regions.

16. The capacitor transducer according to claim 10, further including at least one piezoresistive element bonded to said glass layer of said carrier wafer.

17. The capacitor transducer according to claim 10, wherein said carrier wafer is single crystal silicon of a given conductivity.

18. The capacitor transducer according to claim 17, wherein said conductivity is N type.

19. The capacitor transducer according to claim 10, further including:
    oscillator means coupled to said plates to provide at an output a frequency according to the magnitude of said capacitor.

20. The capacitor transducer according to claim 10, wherein said electrical connection is a diffused area contacting said plate and post.

* * * * *